(12) United States Patent
Heitzinger (10) Patent No.: US 7,913,382 B2
(45) Date of Patent: Mar. 29, 2011

(54) PATTERNED PRINTING PLATES AND PROCESSES FOR PRINTING ELECTRICAL ELEMENTS

(75) Inventor: John M. Heitzinger, St. Louis Park, MN (US)

(73) Assignee: Soligie, Inc., North Mankato, MN (US)

( * ) Notice: Subject to any disclaimer, the term of this patent is extended or adjusted under 35 U.S.C. 154(b) by 42 days.

(21) Appl. No.: 11/977,020

(22) Filed: Oct. 22, 2007

(65) Prior Publication Data

US 2008/0092377 A1  Apr. 24, 2008

Related U.S. Application Data

(60) Provisional application No. 60/862,347, filed on Oct. 20, 2006.

(51) Int. Cl.
*H05K 3/02* (2006.01)
*H05K 3/10* (2006.01)
*H05K 3/30* (2006.01)
*B23P 17/00* (2006.01)
*B21D 53/76* (2006.01)
*B41J 2/01* (2006.01)

(52) U.S. Cl. .......... 29/846; 29/890.1; 29/832; 29/847; 347/101

(58) Field of Classification Search .......... 29/829, 29/890.1, 832, 846, 847; 347/101, 102, 103, 347/105
See application file for complete search history.

(56) References Cited

U.S. PATENT DOCUMENTS

| | | | | |
|---|---|---|---|---|
| 1,934,881 A * | 11/1933 | Quayle, Sr. | .......... | 101/158 |
| 2,638,050 A * | 5/1953 | King | .......... | 101/401.2 |
| 4,264,712 A * | 4/1981 | Kress | .......... | 430/302 |
| 5,164,285 A * | 11/1992 | Takakura | .......... | 430/307 |
| 5,701,815 A * | 12/1997 | Bocko et al. | .......... | 101/211 |
| 5,763,058 A * | 6/1998 | Isen et al. | .......... | 428/209 |
| 5,808,412 A * | 9/1998 | Zovko et al. | .......... | 313/509 |
| 5,895,582 A * | 4/1999 | Wilson et al. | .......... | 216/42 |
| 2002/0100378 A1* | 8/2002 | Dupuis | .......... | 101/135 |
| 2003/0089261 A1* | 5/2003 | Landsman | .......... | 101/467 |
| 2003/0130376 A1* | 7/2003 | Krishnan et al. | .......... | 523/160 |
| 2003/0197909 A1* | 10/2003 | Beyer et al. | .......... | 359/196 |
| 2004/0175550 A1* | 9/2004 | Lawrence et al. | .......... | 428/209 |
| 2005/0185016 A1* | 8/2005 | Mori et al. | .......... | 347/33 |
| 2006/0162592 A1* | 7/2006 | Oberholzer | .......... | 101/153 |
| 2006/0166411 A1* | 7/2006 | Morisue et al. | .......... | 438/149 |

(Continued)

FOREIGN PATENT DOCUMENTS

| | | |
|---|---|---|
| EP | 0 402 942 A2 | 12/1990 |
| JP | 58 034174 A | 2/1983 |
| JP | 7 159984 | 6/1995 |

*Primary Examiner* — A. Dexter Tugbang
*Assistant Examiner* — David P Angwin
(74) *Attorney, Agent, or Firm* — Patterson Thuente Christensen Pedersen, P.A.

(57) ABSTRACT

Printing plates, printing system and method for printing electrical circuits. According to embodiments of the invention, patterned layers of conductive, insulating, semi-conductive materials, and other materials can be additively print deposited on a substrate to form electrical circuits. The electrical circuits so formed of single or multiple printed layers can comprise or compose transistor devices, including thin film transistors, multiple transistor circuits or assemblies, or other electrical devices, for example batteries, sensors, displays, memory arrays, and the like. The invention further provides a patterned printing plate imaged by a photolithography and etch process, and a printing system and methods using the patterned plate by which such high resolution, precise registration electrical circuits and circuit devices can be produced.

9 Claims, 9 Drawing Sheets

U.S. PATENT DOCUMENTS

| | | | |
|---|---|---|---|
| 2006/0211187 A1* | 9/2006 | Choi et al. | 438/197 |
| 2006/0254440 A1* | 11/2006 | Choi et al. | 101/180 |
| 2007/0003604 A1* | 1/2007 | Jones | 424/443 |
| 2007/0128905 A1* | 6/2007 | Speakman | 439/161 |
| 2007/0170403 A1* | 7/2007 | Conaghan et al. | 252/514 |
| 2007/0186971 A1* | 8/2007 | Lochun et al. | 136/256 |
| 2008/0141877 A1* | 6/2008 | De Bruyker et al. | 101/170 |
| 2009/0021686 A1* | 1/2009 | Van Doorn et al. | 349/158 |

\* cited by examiner

Before etching step 114

After etching step 114

PATTERNED PRINTING PLATES AND PROCESSES FOR PRINTING ELECTRICAL ELEMENTS

RELATED APPLICATION

This application claims the benefit of U.S. Provisional Application No. 60/862,347, filed Oct. 20, 2006, which is incorporated herein by reference in its entirety.

FIELD OF THE INVENTION

The invention relates generally to printing plates and printing processes and more particularly, to patterned printing plates and printing processes for forming electrical circuits and circuit components.

BACKGROUND OF THE INVENTION

Flexographic, lithographic, intaglio, gravure and other processes, including those in which a central impression cylinder is used, for printing a wide variety of articles are known in the art. Recently, these and other processes and techniques have been used to print very small, fine features, particularly for forming electrical circuits and circuit components.

Today, the intaglio printing process is oftentimes used for printing very small features. Typically, the intaglio process uses a metal plate that has features engraved into its surface. Often, the engraving is done by hand. Other methods of forming features on the metal plate can also be used as well. The plate can be used in a generally planar state, or, if the plate is thin enough, it can be wrapped around a curved object, such as a cylinder, and used in a high speed printing press.

During the intaglio printing process, the plate is typically inked with a high viscosity, paste-style of ink. The plate is then wiped to remove the excess ink from the top surface, leaving ink only in the recessed areas. A substrate, such as paper, film, and the like, is then brought in contact with the inked plate. A very high pressure is used to transfer the ink from the plate to the substrate. However, the high pressure often results in a deformation of the substrate.

For printed electronics applications, it is desired to print features that are about 10 microns wide or less, and even sub-micron sized features. While the intaglio process is able to print fine features of about 20 microns or less, there are some drawbacks that render traditional intaglio printing for printed electronics applications undesirable.

One drawback of the intaglio process is the fabrication of the plates. Engraving is a slow process, and it can only by done one plate at a time. If done by hand, there is a high rate of error.

Another drawback of the intaglio process is the distortion of the substrate which results in a high degree of surface topology and stress in the substrate. Increased surface topology can negatively impact electronic device performance by reducing printed element quality due to less effective ink transfer on a rough surface for subsequent printed layers. In addition, the distortion of the substrate can create discontinuities in previously printed features. Stress in the substrate can be relaxed in subsequent process steps, such as annealing, leading to changes in dimensions which can also negatively impact electronic device performance because of misalignment between layers, changes in critical dimensions such as the channel length and width of a transistor, and imprecise registration. Another drawback of the intaglio process is the use of a paste ink. For electronic applications, it is desired to print with materials that are relatively pure, such as, for example, a semiconductor or a metal. A paste ink requires the addition of rheology control materials that reduce the purity of the final deposited material, which can negatively impact electronic device performance by reducing the conductivity of a metal or mobility of carriers in a semiconductor material.

Another process that can be used for printing fine features is gravure printing. Gravure printing is generally considered a sub-set of the intaglio process. In gravure, a cylinder is engraved with cells, rather than continuous lines of intaglio printing. Engraving is done with a stylus or a laser. The width, length, and depth of the cell can be controlled. Ink is applied to the cylinder to fill the cells, and the excess is subsequently removed with a doctor blade. Typically, the ink has a much lower viscosity when compared to the intaglio printing process.

A substrate is then brought in contact with the cylinder and pressure is used to assist a transfer of the ink to the substrate. The pressure is lower, however, compared to intaglio printing so there is minimal to no distortion of the substrate. However, gravure printing does have a number of drawbacks, including the minimum feature size that can currently be printed. As stated above, for printed electronics applications, it is desired to print features that are about 10 microns wide or less, and even sub-micron sized features. Today, gravure printing can print a minimum feature size of only about 20 microns.

Another drawback is that the use of the cells in gravure printing results in wavy edge lines, rather than the desired straight lines. Also, the use of cells can create a non-uniform thickness of the deposited ink. The non-uniform thickness of ink can result in discontinuous lines that prevent electrical current flow.

Further, gravure printing cylinder fabrication is cost-restrictive. It is also more difficult to image a gravure cylinder compared to a flat surface due to the curved nature of the cylinder. It can be time and/or cost restrictive, and involves a high risk of error.

Other known additive printing processes, such as flexographic and ink-jet, suffer from several drawbacks as related to the printing of transistors and other small-scale electrical circuits and devices. One drawback relates to a registration and resolution of a printed electrical circuit, such as a transistor comprising multiple individually printed layers. Flexography, for instance, has been reported to print features only as small as about 50 microns and typical flexographic presses have registration control no better than about 40 microns from one printed layer to the next. Ink jet techniques suffer from slow speed and low reliability. Because each layer interacts with other layers to conduct or insulate, elevated printing quality is necessary to form layers that properly interconnect to form an operable electrical device. Another drawback relates to higher costs presently associated with printing electrical circuit devices that meet quality standards. In view of these and other drawbacks, current printing processes are not capable of achieving and maintaining quality standards at micron-measured levels without sacrificing performance, cost, and efficiency.

Currently, electronic devices are commonly created by a photolithography and etching process. Photolithography processes typically used in the silicon-based semiconductor industry are photographic processes used to transfer circuit patterns onto a semiconductor wafer. This is done by projecting light through a patterned reticle, or a glass plate with a layer of chrome or other masking agent on one side, onto a silicon wafer covered with a photosensitive material (photoresist). The exposed portions of the circuit are then wet or dry etched to pattern the circuit. The photolithography process is utilized in the fabrication of electronic devices and circuits because of the ability to etch fine features, such as on the order of 10 microns or less. However, these processes—deposition, photolithography, and etching—are repeated many times in the formation of traditional semiconductor devices thereby creating a large amount of waste, and can be time intensive relative to additive printing processes. Furthermore, because of the time involved and the amount of waste, these processes can be costly compared to additive printing processes.

There remains a need for patterned printing plates, printing systems, and methodologies that are capable of producing high quality electrical circuit products with high resolution fine features, with minimal substrate distortion, precise registration, and at a reduced per-unit cost.

SUMMARY OF THE INVENTION

The present invention resolves many of the above-described deficiencies and drawbacks inherent with printing fine features of micron and submicron dimensions, such as for the printing of electronic circuits. In particular, the invention is directed to a patterned printing plate, printing plate fabrication techniques, printing systems, and methods of printing fine features, suitable for creating three-dimensional electrical circuits, such as transistors, memory arrays, and other devices.

Various embodiments of the invention disclosed and described herein utilize a system of printing plate fabrication techniques in combination with printing systems and processes to create the aforementioned circuits in an additive fashion, rather than through the use of material deposition, photolithography and subtractive etching processes typically used in the silicon-based semiconductor industry. These processes—deposition, photolithography, and etching—are repeated many times in the formation of traditional semiconductor devices; however the processes need to be performed only once to etch a plate that can be used multiple times in a gravure-type printing process. By additively printing electronic devices by simply depositing materials only in specific locations and eliminating photolithography and etching, the fabrication of electronic devices and circuits is greatly simplified and produces a significantly less amount of waste.

In the present invention, photolithography and etching can be used to pattern printing plates and/or printing cylinders with unexpected fine resolution that traditional engraved gravure plates have not been able to achieve. A process is used to transfer the circuit patterns to a printing plate or cylinder, rather than directly to the circuit. This is done by projecting light through a patterned mask, or by concentrating the light onto selective areas of a plate or cylinder covered with a photoresist. The printing plate is subsequently used to additively print the many circuits. Therefore, not only is the printing plate adapted to print fine features necessary for printing of electrical circuits or circuit elements, such as features of 10 microns or less, but the printing plate only requires a single etching step to form the plate, which can in turn, be used many times, such as, for example, thousands of times, to print circuits or circuit elements thereby reducing waste, time, and costs.

In one embodiment, a patterned printing plate on a sliding carriage in combination with an inking system and a substrate-containing cylinder comprises a system to additively print electrical circuits, circuit devices, transistors, and the like. In another embodiment, a patterned printing plate secured to a cylinder in combination with an inking system and a slidable stage carrying a substrate comprises a system to additively print electrical circuits, circuit devices, transistors, and the like. In yet another embodiment, a patterned cylinder in combination with an inking system and a sliding stage carrying a substrate comprises a system to additively print electrical circuits, circuit devices, transistors, and the like. In another embodiment, a system to additively print electrical circuits, circuit devices, transistors, and the like comprises a first printing station with a patterned printing plate on a sliding carriage in combination with an inking system and a substrate containing cylinder to print a first material or materials; and a second printing station with a patterned printing plate secured to a cylinder in combination with an inking system and a slidable stage carrying a substrate to print subsequent materials. Alternatively, the second printing station can comprise a directly etched cylinder in place of the patterned printing plate secured to the cylinder. The printing systems can advantageously provide a precise registration and high resolution necessary to create functional printed three-dimensional electrical circuits according to desired quality standards, while significantly reducing the waste produced in traditional etching processes.

The above summary of the invention is not intended to describe each illustrated embodiment or every implementation of the present invention. The figures and the detailed description that follow more particularly exemplify these embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The electrical circuit printing systems and methods of the present invention provide precise registration and high resolution processes for the creation of electrical circuit devices. The invention can be more readily understood by reference to FIGS. 1-11 and the following description. While the invention is not necessarily limited to such an application, the invention will be better appreciated using a discussion of exemplary embodiments in specific contexts.

Patterned layers of conductive, insulating, semi-conductive, and other materials are print deposited on a flexible and/or non-flexible substrate to form electrical circuits according to the invention. The electrical circuits so formed of single or multiple printed layers can comprise or compose electrical devices, including transistors, diodes, organic thin film transistors, multiple transistor circuits or assemblies, or other electrical devices, for example ring oscillators, operational amplifiers, batteries, sensors, displays, memory arrays, and the like. The invention further provides processes and methods by which high resolution, precisely registered electrical circuits and circuit devices can be produced at relatively high speed and volume when compared to traditional electrical component manufacturing techniques and without the need for more complex and costly manufacturing devices and machinery.

In one embodiment, the electrical circuit printing process and method create transistor devices, more particularly thin film transistors (TFTs). Transistor devices in general comprise source and drain, semiconductor, dielectric, and gate layers. Patterned layers therefore can comprise conductive, semiconductive, and insulating materials printed with suitably formulated conductive, insulative, or semiconductive ink, fluid, powder, particulate, or other deposition compositions. In a TFT, the semiconductor layer can comprise an organic material, for example a polymer, or an inorganic material, such as, for example, silicon or zinc oxide. Transistors can be used to form radio frequency identification (RFID) circuits or "tags," passive or active "smart labels," displays and drivers, and other devices or combinations thereof.

As stated earlier, one of the challenges of printing fine features is making a plate that can carry a low-viscosity ink and have features that are about 10 microns or less. In one embodiment of the invention, referring generally to FIG. 1, a printing plate is fabricated using process 100. A resulting flat etched plate can then be used in a printing system, as described in more detail below, to achieve such results. The following describes plate fabrication processes, followed by methods of printing electrical circuits using the fabricated plates in printing systems.

Figure 1:
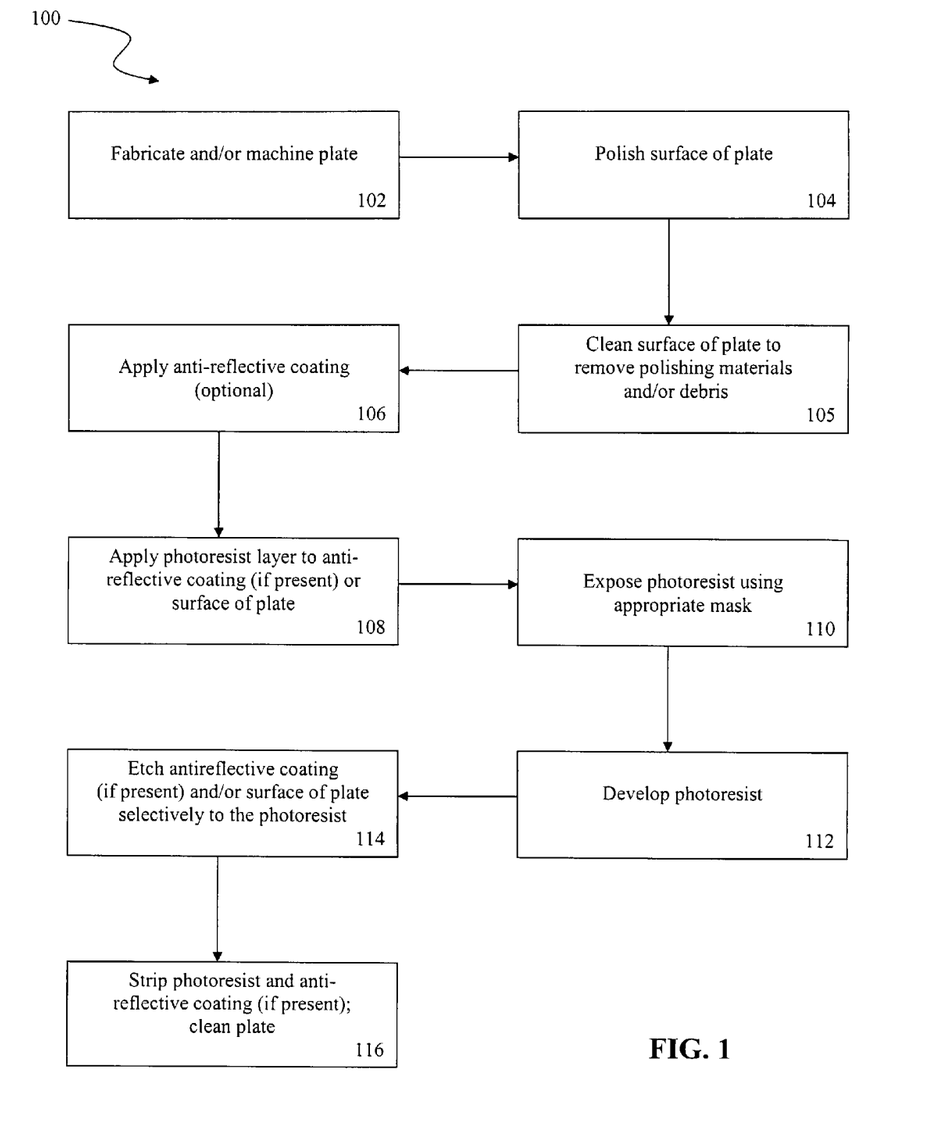
FIG. 1 is a flowchart of plate fabrication according to one embodiment of the invention.
Figure 2A:
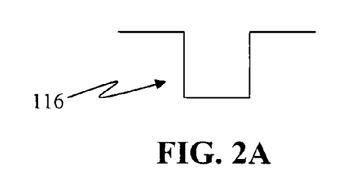
FIGS. 2A-2D are exemplary sidewall profiles according to embodiments of the invention.
Figure 2B:
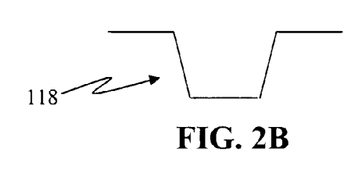
Figure 2C:
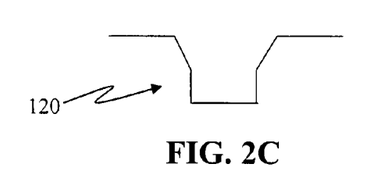
Figure 2D:
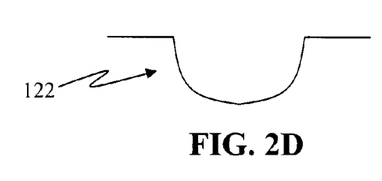
Figure 3A:
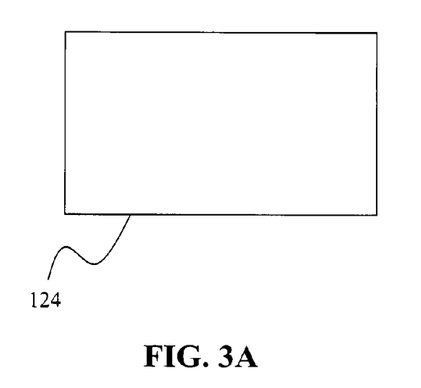
FIGS. 3A and 3B are a top view of a printing plate according to one embodiment of the invention.
Figure 3B:
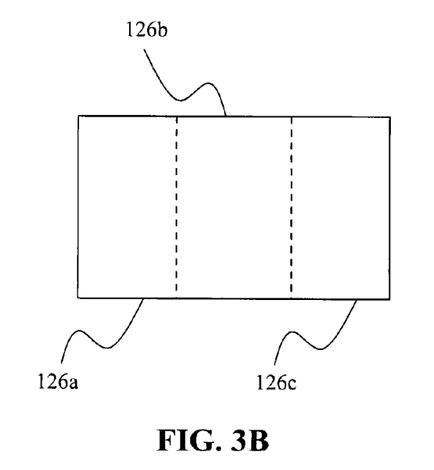

It is contemplated that plate fabrication process 100 is able to produce features with sizes from about 10 to about 100 microns down to about 180 nanometers. Initially, a blank plate is fabricated at step 102 to an appropriate size and shape, such as, for example, square, rectangular, round, or some other shape. The plate can be subsequently machined before and/or after etching to have a different shape and/or size. For example, a round plate may be subsequently machined to a rectangular plate at any step in process 100. As shown in FIG. 3A, a blank plate can be fabricated to a size appropriate to produce a single patterned plate 124. Alternatively, as shown in FIG. 3B, the blank plate can be further machined to produce multiple plates 126 once the blank plate is etched.

In one embodiment of the present invention, the plate can comprise a single material such as, for example, copper, chromium, aluminum, nickel, cobalt, stainless steel, polytetrafluoroethylene (PTFE), polyvinyl chloride (PVC), or other polymers and mixtures of polymers, and other suitable materials. In another embodiment of the present invention, the plate can comprise an alloy, such as a nickel iron alloy or nickel chromium alloy, to reduce the effect of thermal expansion, to provide superior wear resistance or improved mechanical stability, to provide superior corrosion resistance, and/or to provide better compatibility with the inks. Suitable alloys are commercially available Invar and Inconel®. In yet another embodiment of the present invention, the plate can comprise layers of different materials, for example a copper plate coated with chromium, as is commonly used in the fabrication of gravure cylinders.

In polishing step 104, the surface of the blank plate is polished to achieve a generally smooth surface with a surface roughness from about one micron RMS to about 0.1 micron RMS, and more preferably, about 0.01 micron RMS in one embodiment. It is desirable to have a flat, smooth surface to achieve the desired fine features. In one embodiment of the invention, polishing step 104 can comprise a chemical mechanical planarization process, such as, for example, copper chemical mechanical planarization. The polishing step reduces scratches and other blemishes in the surface of the plate. If the plate is not polished to a sufficient roughness, it has been found that the printing inks or materials can flow into such scratches, which are then transferred to the substrate in the printing process. For critical layers, such as source electrodes and drain electrodes, such flaws can cause an electrical device, such as a circuit, to short, resulting in a non-functional transistor.

Following the polishing step, a cleaning step 105 is typically desired to remove materials used in the polishing process and any debris from the surface of the plate.

An antireflective coating can be applied in optional step 106 to the polished surface of the plate. Application of the antireflective coating can improve the ability to produce fine features in the plate by reducing the effect of reflected light during photoresist exposure step 110. The antireflective coating absorbs the light used to expose the photoresist so that it does not reflect off of the polished surface, exposing photoresist that should otherwise not be exposed.

In step 108, a photoresist material is applied to either the polished surface directly after step 105, or subsequent to the application of the antireflective coating in step 106. The photoresist material can be either a positive tone which has a higher developer dissolution rate after being exposed to light, or a negative tone in which the photoresist becomes relatively insoluble to developer when exposed to light. The photoresist can be applied by spin coating, roll coating, or some other suitable process. In one embodiment of the invention, round-shaped blank plates may offer the benefit of a more uniform antireflective and photoresist coating when compared to a square or rectangular blank plate when the antireflective coating or photoresist is deposited by spin-coating. This is due to the symmetry of the round structure wherein the edges of the disc are equidistant from the position of the initial photoresist dispense, usually the center of the plate.

In step 110, an appropriate mask can be applied and the unmasked photoresist is exposed. In an alternative embodiment, a mask is not needed and selected exposure is done using a laser, or electron beam that focuses the light on selected portions of the photoresist material. The exposure can typically be done by using a UV light source. The photoresist is then developed in step 112 with an appropriate liquid chemical developer chosen based on the type of photoresist that is used. The photoresist can be developed, for example, by submerging the printing plate within the developer. If a positive tone photoresist is used, the exposed areas are removed during step 112. If a negative tone photoresist is used, the unexposed areas are removed during step 112 because the exposed areas are insoluble to the developer chemical. Step 112 results in a raised image with exposed areas of the plate where the photoresist has been removed.

The plate, with or without an antireflective coating, is subsequently etched in step 114 selective to the photoresist. That is, the plate material is etched at a high rate and the photoresist is etched at a substantially slower rate or not etched at all. Etching step 114 can be accomplished by either wet etching in which liquid chemicals are used or by dry etching in which gas phase chemicals are used. Wet etching is typically a purely chemical process, wherein the liquid chemicals remove exposed areas of the flat plate, and wet etching is mainly isotropic. However, in some cases etching can proceed in a preferred direction depending on the material and its microstructure. This can, in turn, impact the shape of the resulting etched feature.

Dry etching is the removal of a substrate material, such as the plate material, through use of a gas interacting with the material to be etched. In most cases, a combination of physical and chemical processes is used through the introduction of a plasma. A voltage is applied to the item to be etched, such as the plate in this case, and a plasma is formed above the area to be etched, as is well known in the art. The voltage difference between the plasma and the plate surface causes ions to accelerate toward and bombard the plate surface, resulting in physical removal of material on the exposed surfaces of the plate. The gas phase chemicals, when in contact with the plate surface, also remove material on the exposed surfaces of the plate by a chemical mechanism. Dry etching can be used to impart a high degree of anisotropy, allowing one skilled in the art to create high aspect ratio features if desired. In addition, with the proper choice of chemicals, the sidewall profile of the etched feature can be controlled more tightly than with wet etching. For example, a protective layer can be built up on a side wall allowing different profiles, such as slopes, tapered features and the like. Referring generally to FIGS. 2A-2D, a variety of sidewall profiles can be accomplished using dry etching. By controlling the sidewall profile, one can more closely control the amount of ink transferred to the substrate because the volume of the ink in the etched feature is directly related to the profile of the sidewalls.

Further, a combination of wet and dry etching can be used. The etching chemistry can be varied, such as by varying acid types, pH values, molarity and the like. Furthermore, the etching chemistry can be tailored to the material to be etched for the purpose of closely controlling the amount of printing material, such as a low-viscosity ink to be transferred to the substrate. The viscosities of the inks can also be varied depending on the chemistry of the plate. Furthermore the plasma gas and other common parameters of a dry etching process can be optimized to attain the most fine, precise features, reducing flaws in the patterns or image.

In stripping step 116, the remaining photoresist and antireflective coating are stripped from the plate and the plate is cleaned, resulting in a relief patterned printing plate.

Figure 4:
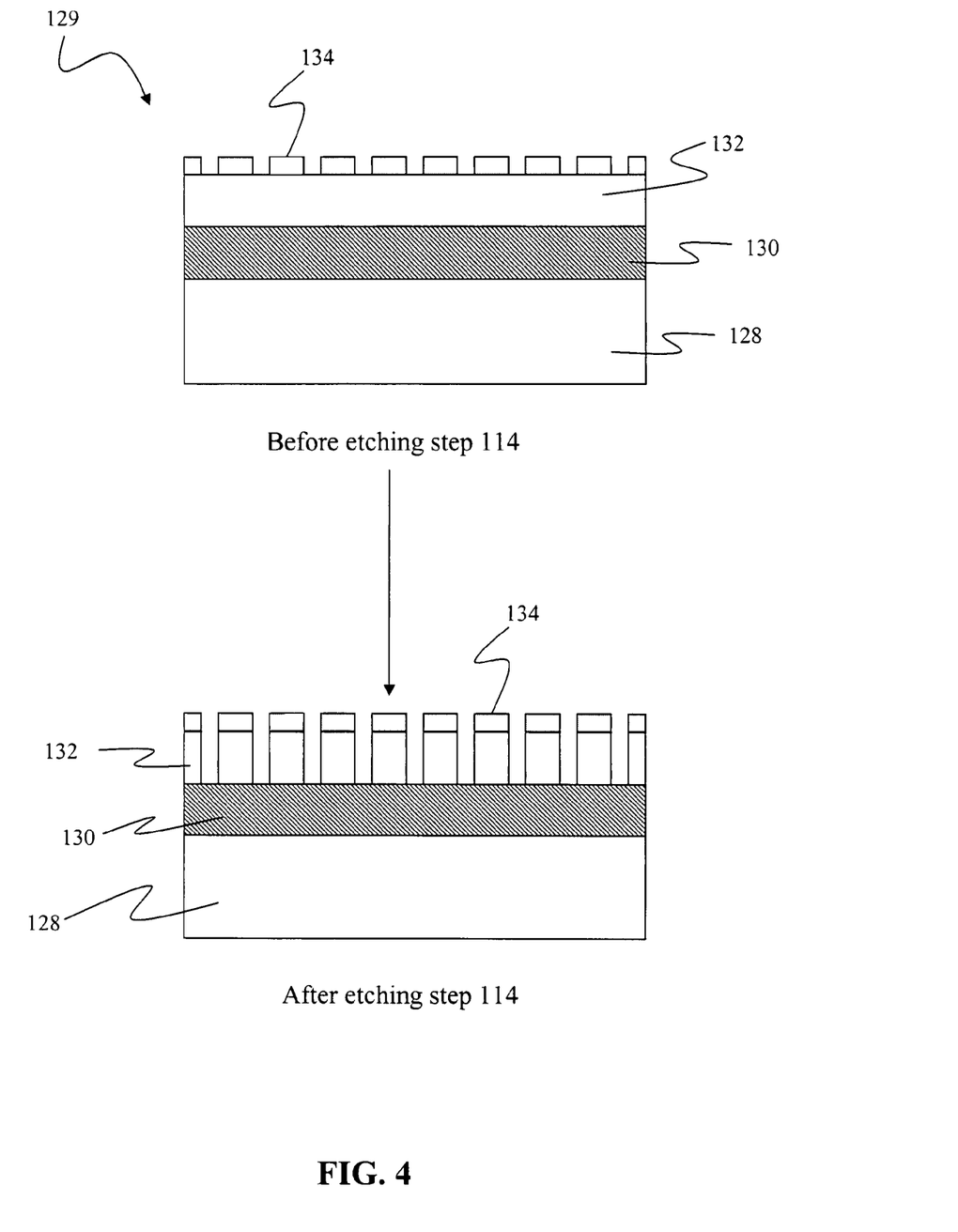
FIG. 4 is a layer diagram according to one embodiment of the invention.

Referring to FIG. 4, an etch stop layer 130 can be used to precisely determine and control the etch depth. A plate 129 can comprise a printing plate 128 of one material, coated with layer 130 of etch stop material, followed by a top layer 132 of material to be etched and photoresist 134. Top layer 132 can comprise the same or different material as printing plate 128. During etching step 114, the exposed surface of plate 129, with or without antireflective coating, is etched, either by wet etching or dry etching, until etch stop material layer 130 is reached. For example, with wet or dry etching, top material layer 132 can be removed in the exposed areas, whereas etch stop layer 130 is resistant to the chosen etchant. When wet etching is used, the etch bath can be analyzed using a spectrophotometer to determine when to stop the etch. If dry etching is used, the resulting removed material can be analyzed with a gas phase analyzer, such as a mass spectrometer, or a spectrophotometer to determine when to stop the etching process or change the etch chemistry.

In one embodiment of the invention, a thin, and/or flexible plate is desired. For example, a thin plate can be mounted or secured, either releasably or permanently, to a planar surface, such as, for example, a flatbed or platen style printing press. Alternatively, a thin, flexible plate can be mounted or secured, either releasably or permanently, to a non-planar surface, such as, for example, a cylinder such as is used in rotogravure printing. The thin plate can be secured by attachment means such as adhesive, magnets, vacuum, mechanical clamps, and the like.

Figure 5:
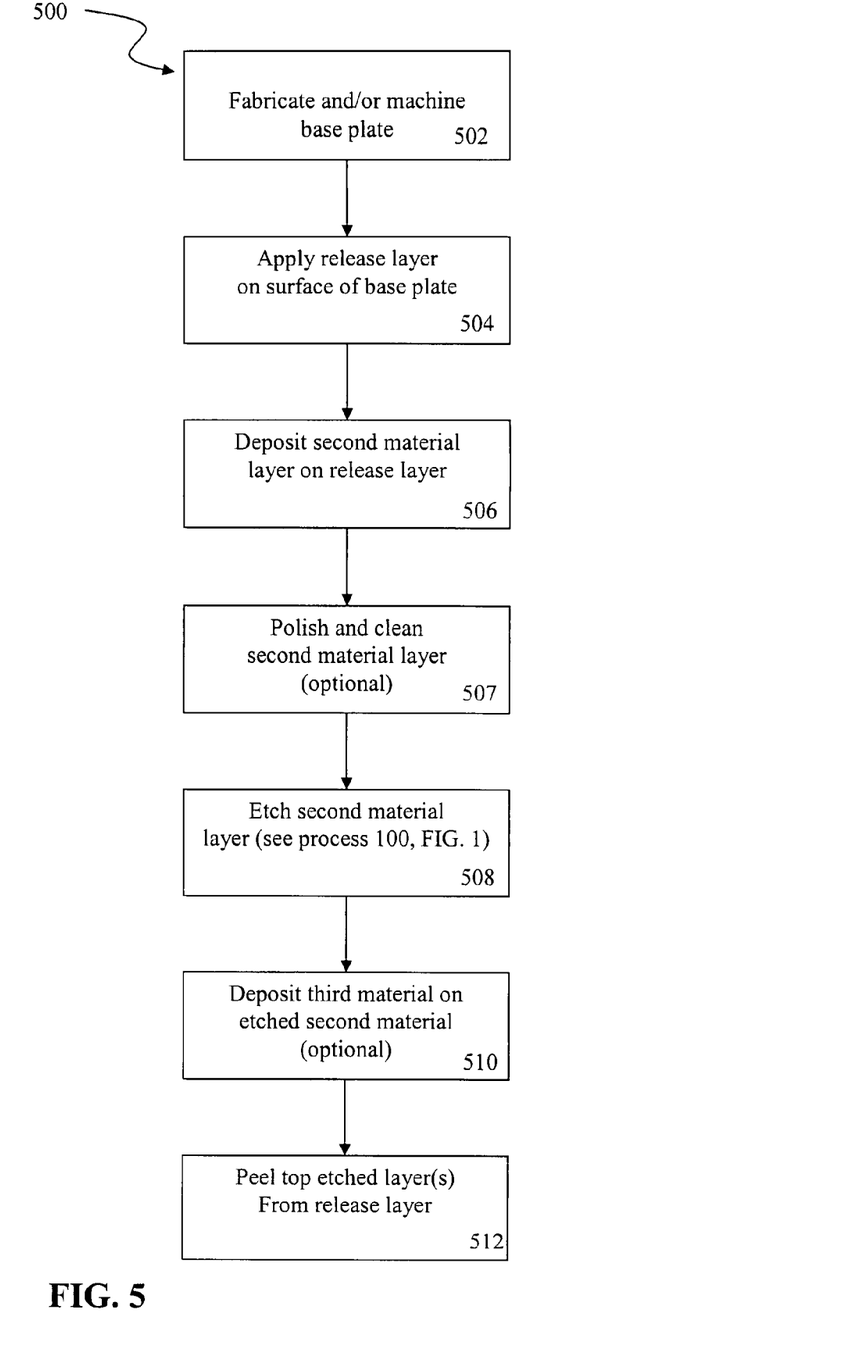
FIG. 5 is a flowchart of thin plate fabrication according to one embodiment of the invention

FIG. 5 illustrates a thin plate fabrication process 500. A thick printing plate, such as a copper plate, is fabricated in step 502, similar to step 102 in FIG. 1. A release layer, or a release compound, is deposited on the surface of the printing plate in step 504. A subsequent layer, such as an additional copper layer, is deposited on the release layer in step 506. The subsequent layer can be electroplated, electrolessly plated, sputter-coated, or other such deposition techniques. An optional polishing and cleaning step 507 can then be performed to provide a flat, smooth surface. The top layer is then etched in step 508, such as by a process similar to process 100 in FIG. 1 using a photoresist, to produce a fine-featured top layer. After etching step 508, the top layer can optionally be coated with another metal, such as chromium, as shown in step 510. The top etched layer and optional chromium layer are then peeled in step 512 from the release layer and printing plate, resulting in a thin, flexible, fine-featured plate.

In one embodiment of the present invention, the surface properties of the etched plate can be further controlled by treating the surface of the etched features to make them more or less hydrophobic. This optional step will impact how the ink interacts with the etched feature(s). For example, treating the etched areas with hexamethyldisilazane (HMDS) before stripping the photoresist results in a strongly hydrophobic area in the etched regions while the non-etched areas covered by photoresist will maintain the initial surface properties. This will result in solvent-based inks being highly attracted to the etched areas and less attracted, or possibly repelled, to the non-etched areas.

In another embodiment of the invention, the plate making processes 100 and 500 as described herein can be used for certain critical layers, while standard plate making processes using electromechanical or laser engraving can be used for non-critical layers.

Figure 6:
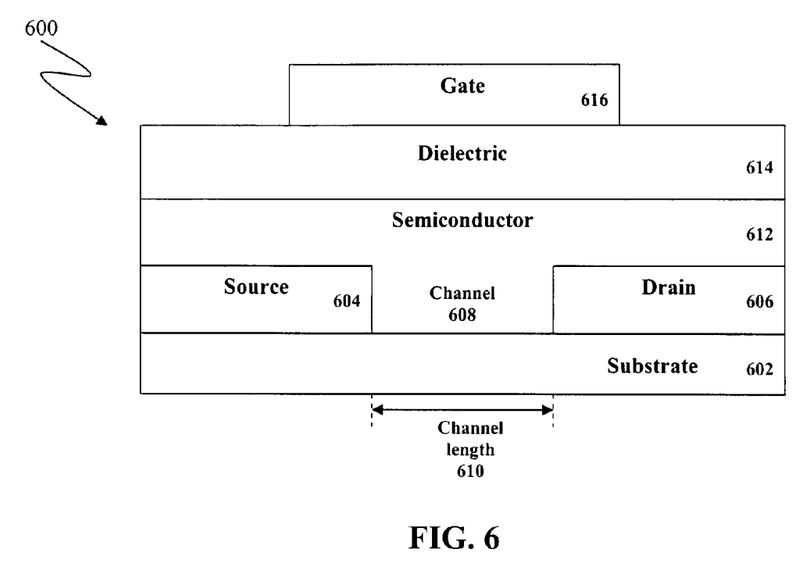
FIG. 6 is a layer diagram of a thin film transistor according to one embodiment of the invention
Figure 7:
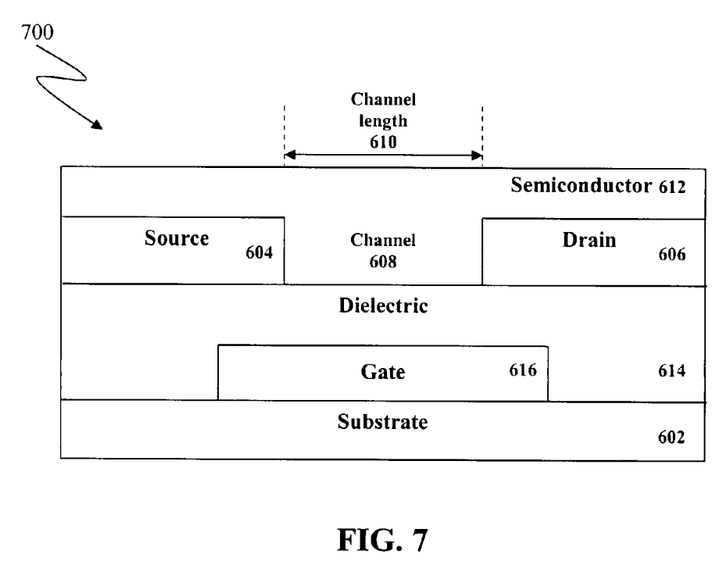
FIG. 7 is a layer diagram of a thin film transistor according to one embodiment of the invention.

The patterned plates described above can then be used in printing processes to print fine-featured articles, such as thin film transistors (TFTs) that require high resolution. FIGS. 6 and 7 depict typical TFT construction.

In one embodiment of the invention as shown in FIG. 6, a TFT 600 is formed by depositing a conductive material, such as a metal or a conductive polymer, on a substrate 602 to create source 604 and drain 606 lines and channel 608. Channel 608 is the space between source 604 and drain 606, and has a channel length 610. Substrate 602 can comprise film, paper, glass, silicon, ceramics, and other suitable materials. Following deposition of source 604 and drain 606 lines, semiconductor 612 is deposited over source 604 and drain 606, preferably only in channel 608. Subsequently, a dielectric 614 is deposited over source 604, drain 606, and semiconductor in the channel 608. Finally, gate 616 is deposited. Gate 616 can comprise a conductive material such as, for example, a metal or conductive polymer.

In an alternative embodiment of the invention, as shown in FIG. 7, gate 616 is deposited on the substrate. Dielectric 614 is deposited over gate 616. Source 604 and drain 606 are then deposited on dielectric 614, forming channel 608 of channel length 610. Finally, semiconductor 612 is deposited over source 604 and drain 606 and/or within channel 608.

As discussed above, in order to create a functional electronic circuit, such as a TFT, the various layers must line up, interconnect, or otherwise register with each other. Also, it is desired to have a channel length 610 as small as possible. Such precise registration and fine printing of features can be achieved by printing stations described below and depicted in FIGS. 8 and 9, and the printing system described below and depicted in FIG. 10.

Figure 8:
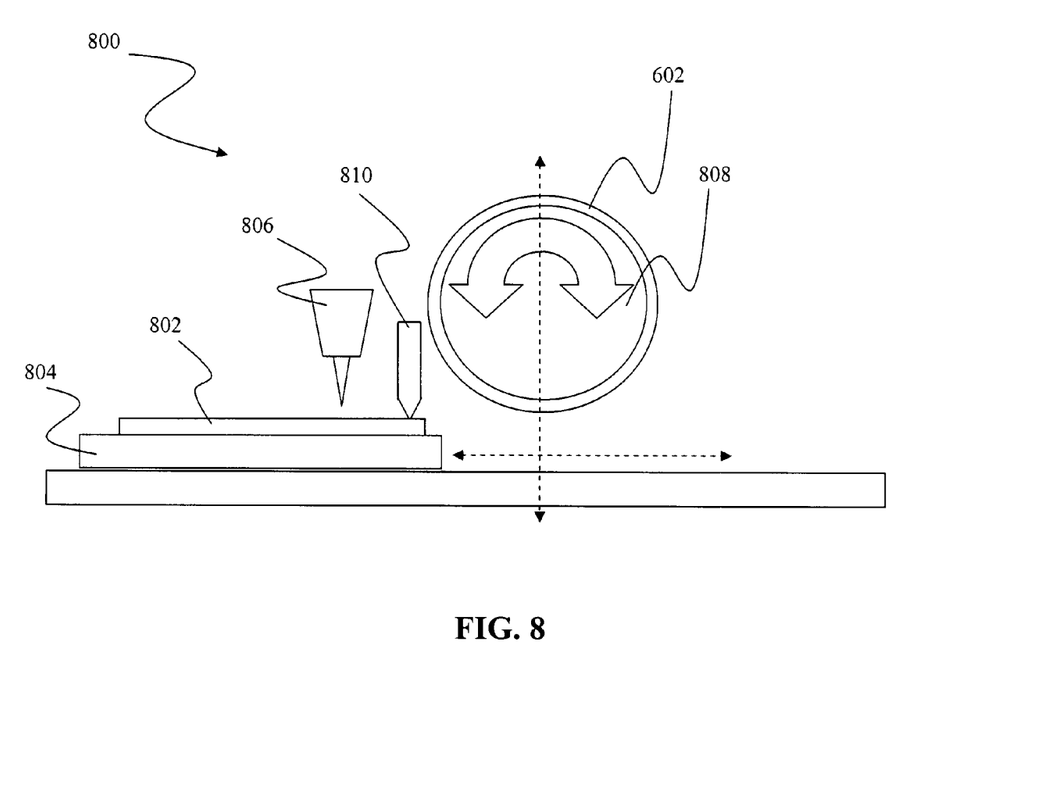
FIG. 8 is a printing station according to one embodiment of the invention.

In one embodiment of the invention, as illustrated in FIG. 8, printing station 800 generally comprises an etched flat plate 802 mounted to slidable carriage 804, an inking system 806, and a cylinder 808 capable of rotating substrate 602. Etched flat plate 802 is prepared by fabrication processes 100 or 500. Etched flat plate 802 is then mounted to a slidable carriage 804 so that the imaged surface is facing opposite carriage 804. Slidable carriage 804 can be of similar design to those commercially available from Nemark Systems, Inc., in one embodiment, comprising a precision machined leadscrew and two parallel bars, for example, and can translate in a two-dimensional plane. It may be desired to alter or enhance commercially available slide systems to allow the systems to withstand the relatively high pressure used in the printing process, to allow them to move at a higher rate of speed, and/or to allow them to be translated and/or positioned more precisely. Etched flat plate 802 is mounted to slidable carriage 804 by a fastener such as, for example, adhesive, magnets, vacuum, mechanical clamps, or other suitable fasteners and combinations thereof. Substrate 602 is at least partially mounted, or in contact with cylinder 808, by a fastener as described above, or other such fastening means, such as a vacuum and the like. Substrate 602 can comprise a web that is threaded around cylinder 808, possibly with the use of nip rollers to maintain good contact between the web and the cylinder, or substrate 602 can comprise discreet sheets with a length less than or equal to the circumference of cylinder 808.

Inking system 806 can comprise a simple spray system or roller system where a low-viscosity ink is applied to plate 802 to fill the etched features. Excess ink can be removed by various means, such as a doctor blade. Alternatively, inking system 806 can comprise a high precision ink jet system. Use of an ink jet system reduces the amount of ink used as the ink jet system can be programmed to deposit ink on plate 802 only where desired.

Substrate 602 can be mounted to cylinder 808 by fastening means as described above in such a way as to allow a portion of substrate 602 to be released from cylinder 808 while the remaining portion stays in intimate contact with cylinder 808. This may be beneficial, for instance, in effective transfer of substrates to and from cylinder 808. For example, a series of small holes could be used to produce a vacuum and hold substrate 602 to cylinder 808. The vacuum can be applied to only a portion of the holes allowing a gripper to grip substrate 602 and subsequently remove substrate 602 from cylinder 808 when the vacuum is terminated.

To print, substrate 602 is mounted to cylinder 808. Cylinder 808 is translated vertically to ensure that contact with sufficient pressure will occur as slidable carriage 804 is adjusted in a two-dimensional plane and plate 802 is brought into contact with substrate 602 mounted to cylinder 808. Cylinder 808 rotates as plate 802 is passed under cylinder 808, bringing substrate 602 into contact with plate 802. Ink is applied to plate 802 by inking system 806 as plate 802 is moved. A doctor blade 810, or similar device, can be used to force ink into the etched areas of plate 802 and/or to remove excess ink from plate 802.

Figure 9:
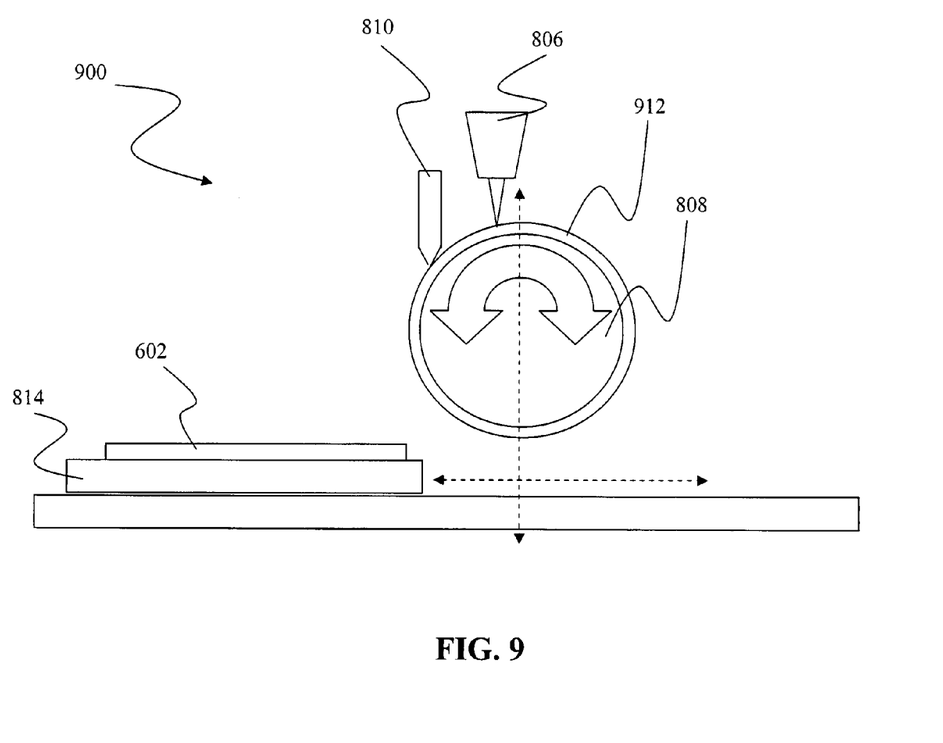
FIG. 9 is a printing station according to one embodiment of the invention.

In an alternative embodiment, as shown in FIG. 9, a printing station 900 comprises a cylinder 808 with a thin, flexible plate 912 mounted to the circumference of cylinder 908, a slidable stage 814, and inking system 806. Flexible plate 912 can be fabricated by process 500 so that it can be wrapped around cylinder 908. Substrate 602 with alignment marks is mounted with mounting means as described above to slidable stage 814. An alignment procedure is carried out, moving the stage in a two-dimensional plane as appropriate including angular adjustment if needed. Stage 814 is passed under cylinder 908 as cylinder 908 rotates. Inking system 806 and optional doctor blade 810 can be used to apply and control the ink as described above. In addition, inking system 806 and doctor blade 810 can be combined to form a closed doctor blade system with an ink reservoir as is currently used in the art. Ink is transferred from plate 912 to substrate 602 as stage 814 passes under cylinder 908. Printing station 900 described in FIG. 9 minimizes substrate distortion. It also allows for precise registration with respect to existing layers prior to printing of each subsequent layer.

In yet another embodiment, cylinder 908 is directly etched using a fabrication process similar to that described in process 100. A photoresist can be imaged in a planar state, and then removed from a printing plate. The photoresist is then mounted to the outer surface of cylinder 908 and etched by either wet or dry etching processes as described above. A printing system similar to printing system 900 is used to print fine features, such as electronic circuits. An inking system applies ink to the etched cylinder. As substrate 602, mounted to a sliding stage, is passed under the etched cylinder as it rotates, ink is transferred from the cylinder to the substrate. Subsequent curing and/or printing stations allow multiple layers to be printed with precise registration, resulting in high resolution features.

In another embodiment of the invention, a printing station is designed similarly to printing station 900 in FIG. 9, except that slidable stage 814 is replaced by a semi-rigid conveyor belt system. Substrate 602 with alignment marks is mounted with mounting means, as described above, to the conveyor belt. The conveyor belt with attached substrate 602 is passed under cylinder 908 as cylinder 908 rotates. Inking system 806 and optional doctor blade 810 can be used to apply and control the ink as described above. Ink is transferred from plate 912 to substrate 602 as the conveyor belt passes under cylinder 908. In this embodiment, substrate 602 may be a web or in sheet form.

Figure 10:
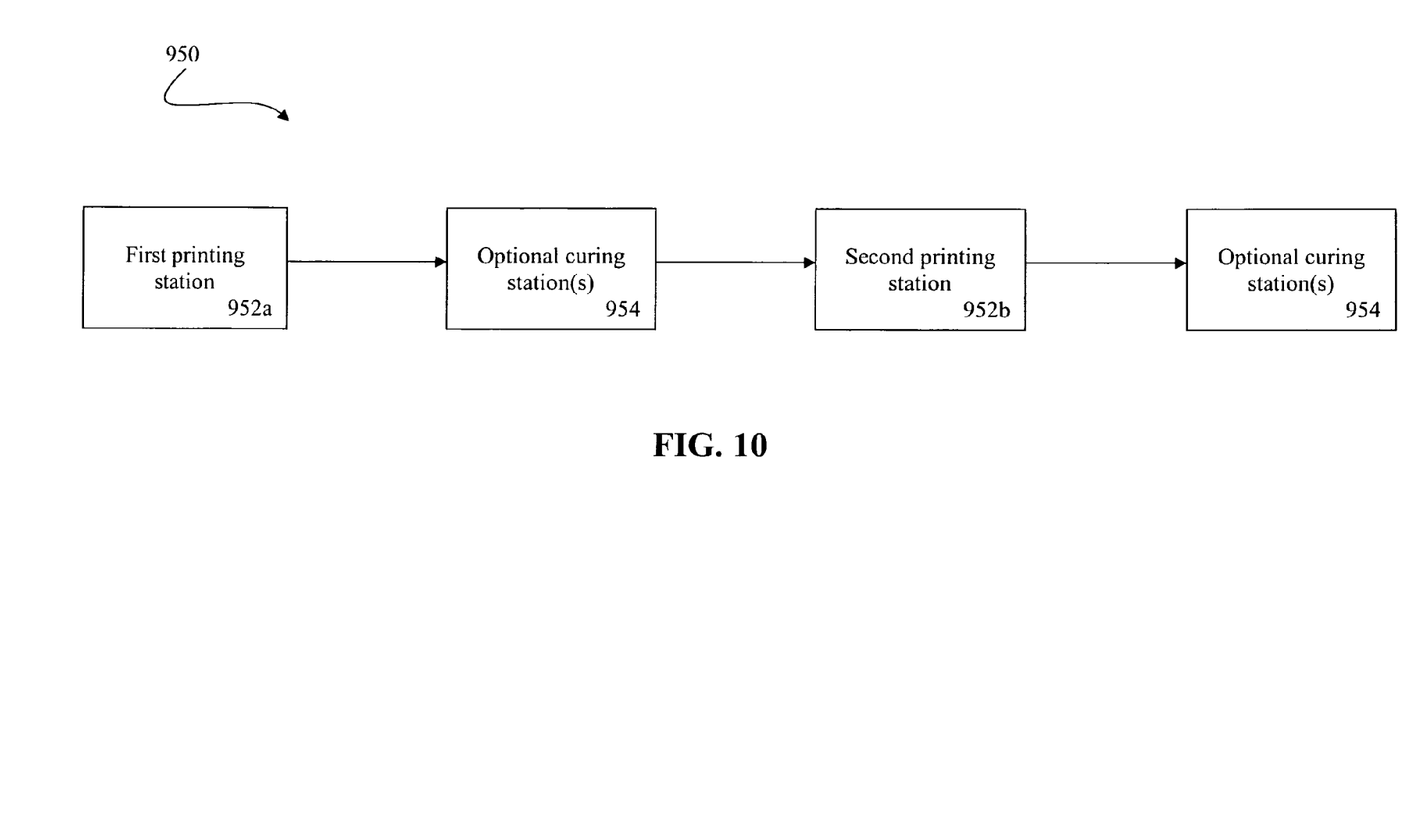
FIG. 10 is a printing system according to one embodiment of the invention.

In another embodiment of the invention depicted in FIG. 10, a printing system 950 comprises at least one or a plurality of print stations 952a and 952b. First printing station 952a can comprise printing station 800 of FIG. 8, and second printing station 952b can comprise printing station 900 of FIG. 9. In an alternative embodiment, first printing station 952a can comprise printing station 900, and second printing station 952b can comprise printing station 800. In yet another embodiment, printing stations 952a and 952b can comprise the same-styled printing station, either printing station 800 or printing station 900. One or more optional curing stations 954 and/or printing stations can be placed before or after any print station.

In any of the aforementioned embodiments of printing system 950, printing station 952a deposits a first material on substrate 602. After the first features are deposited on substrate 602, such as source 604 and drain 606 depicted in FIG. 6, substrate 602 can be removed from printing station 952a. Substrate 602 with printed features can then optionally be cured at curing station 954 by heat, ultraviolet light, electron beam, infrared, microwave, laser, and other such curing systems and methods, depending on the cure mechanism of the deposited material. Substrate 602 is then transferred to second printing station 952b. Here, alignment marks printed as part of the deposition of the first material or layer, are used to align the substrate so that the next printed layer, such as semiconductor 612 depicted in FIG. 6, can be deposited on the first printed layer with precise registration. After the second features are deposited on substrate 602, substrate 602 can be optionally cured at curing station 954 by heat, ultraviolet light, electron beam, infrared, microwave, laser, and other such curing systems and methods.

Additional printing steps and/or curing steps can be repeated until a complete TFT, such as is depicted in FIG. 6, is produced. Additional printing steps, if desired, can be performed on first printing station 952a, second printing station 952b, additional printing stations, or any combination thereof. Additional printing stations can comprise a printing station similar in style to printing station 800 of FIG. 8, printing station 900 of FIG. 9, other suitable printing stations, or any combination thereof. Other suitable printing stations can include printing stations for traditional printing processes such as, for example, flexography, ink jet, lithography, offset lithography, screen printing, traditional gravure, intaglio, and the like. Printing system 950 can also be used to print TFT 700 as shown in FIG. 7.

In another embodiment, printing station 800 or 900 is used to print multiple layers of an electronic device by changing the plates after each layer is printed, keeping the substrate attached to the cylinder of flat stage, respectively, until the printing of the multiple layers is completed. Therefore, a single printing station can be used for some or all of the printed layers. In an alternative embodiment, multiple plates can be attached to carriage 804 so as to allow a more continuous process of printing multiple layers rather than changing plates. In yet another alternative embodiment, multiple cylinders and printing plates may be used in printing system 900 such that stage 814 with substrate 602 can pass under each of the cylinders allowing for multiple layers to be printed on a single system.

Figure 11:
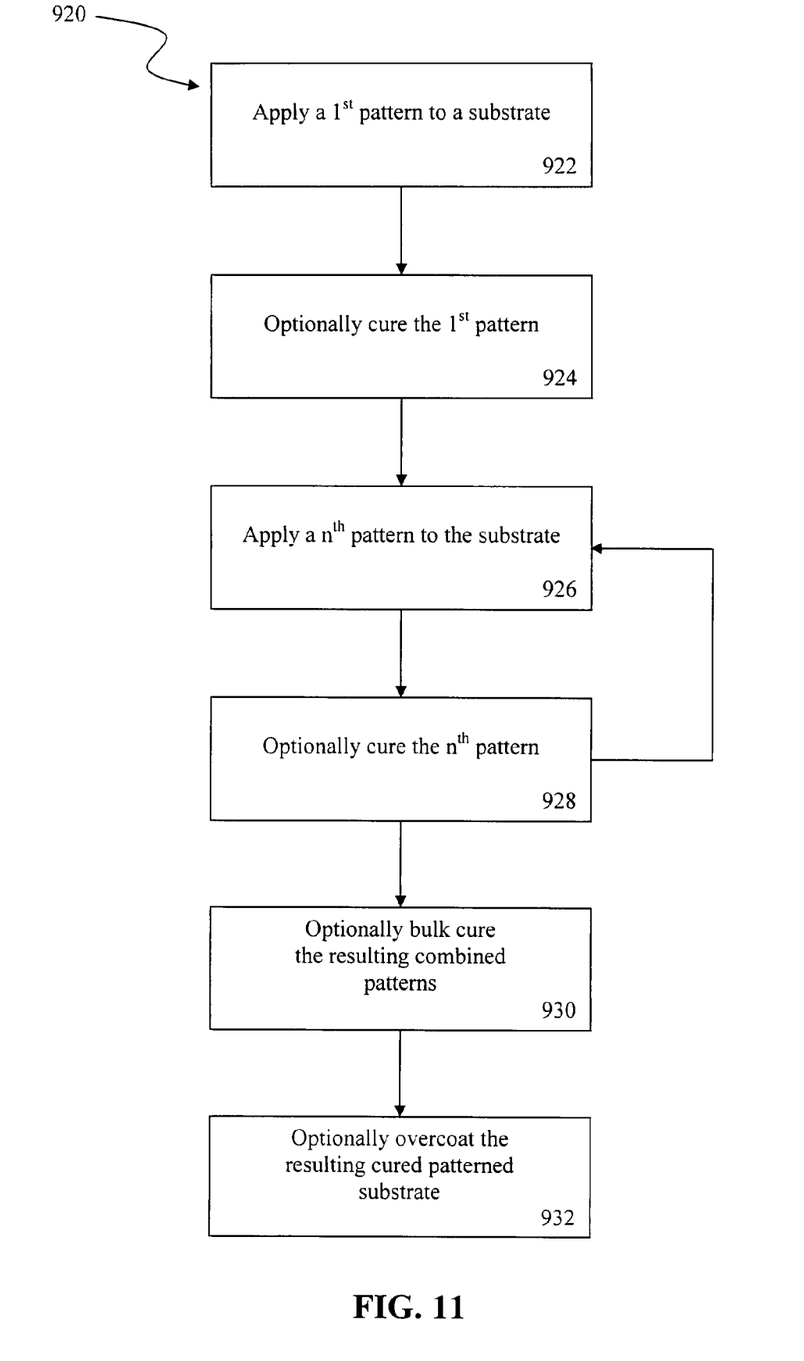
FIG. 11 is a flowchart according to one embodiment of the invention.

Referring generally to FIG. 11, a printing method 920 that incorporates patterned printing plates, printing stations, and printing systems described above to additively print multiple layers or features on a substrate 602 comprises at least two printing steps and one or more optional curing steps. In step 922, a first pattern is printed on a substrate. The first pattern is optionally cured in step 924. At least one additional layer is printed in step 926, and optionally cured in step 928. A bulk cure step 930, after all layers are deposited, is optional. Finally, the resulting patterned substrate can optionally be coated with an overcoat in step 932.

The printing systems, printing plates, and methods of printing as described herein allow for a gravure-type printing of fine features, including features of 10 microns or less, with minimal substrate distortion, using low viscosity inks, achieving uniform ink lay-down, or deposition. As described above, gravure printing has never before been capable of printing such fine features. However, by incorporating a photolithography process to etch a gravure-type plate, unexpected results, such as fine resolutions for the purposes of printing electrical circuits and circuit elements, have been accomplished. Furthermore, by incorporating a polishing step, it was found that the occurrence of flaws was significantly reduced resulting in more precise printing of electrical circuits and circuit elements. Resolution aside, by etching the plate a single time rather than a semiconductor wafer that requires multiple stages of etching, the method of creating the imaged pattern plate can reduce waste, reduce cost, and reduce the time compared to the traditional production of electrical devices.

The invention may be embodied in other specific forms without departing from the essential attributes thereof; therefore, the illustrated embodiments should be considered in all respects as illustrative and not restrictive.

What is claimed:

1. A process for creating electrical circuits or circuit elements using imaged gravure printing plates, the process comprising:
    obtaining a gravure printing plate imaged by etching a substantially flat plate;
    mounting the imaged gravure printing plate to a printing apparatus, wherein the imaged gravure printing plate comprises an image configured to create an electrical circuit or circuit element with features of 10 microns or less, and wherein the printing apparatus comprises
        a cylinder, and
        a carriage adapted to be moved into contact with the cylinder, wherein a substrate to be printed is mounted to one of either the cylinder or the carriage, and the imaged gravure printing plate is mounted to the other of the cylinder or the carriage;
    applying a material to be deposited on the substrate to the imaged gravure printing plate wherein the material is present in the etched areas of the imaged gravure printing plate;
    directly contacting the substrate with the imaged gravure printing plate to transfer the material from the imaged gravure printing plate to the substrate; and
    removing the substrate from contact with the imaged gravure printing plate,
    wherein the material forms a first patterned layer of an electrical circuit or circuit element on the substrate corresponding to the image of the imaged gravure printing plate.

2. The process of claim 1, further comprising:
    curing the first patterned layer on the substrate by heat, IR, UV light, electron beam, or combinations, thereof.

3. The process of claim 1, further comprising:
    depositing at least one additional patterned layer to either the substrate or the previously deposited layer by the process of claim 1 to form an additively printed electrical circuit or a circuit element, wherein a separate imaged printing plate and a separate material is used for each additional layer.

4. The process of claim 3, wherein the material is selected from the group consisting of a conductive material, semiconductor, dielectric, and combinations thereof.

5. The process of claim 1, wherein electrical circuit comprises a thin film transistor comprising either:
    a first configuration comprising a source electrode and a drain electrode spaced apart on the substrate, a semiconductor layer positioned between the source electrode and the drain electrode, a dielectric layer covering at least a portion of the semiconductor layer, and a gate electrode covering at least a portion of the dielectric layer; or
    a second configuration comprising a gate electrode on the substrate, a dielectric layer on the substrate and covering at least a portion of the gate electrode, a source electrode and a drain electrode spaced apart on the dielectric layer, and a semiconductor layer on the dielectric layer between the source electrode and the drain electrode.

6. The process of claim 1, wherein the imaged gravure printing plate is mounted to the printing apparatus by a mounting means selected from the group consisting of magnetic, adhesive, mechanical, electrostatic, vacuum, and combinations thereof.

7. The process of claim 1, wherein the imaged gravure printing plate is adapted to print electrical circuits or circuit elements comprising features of about 10 microns or less in width.

8. The process of claim 1, further comprising:
additively printing at least one additional layers of the electrical circuit or circuit element, wherein each additional printed layer is printed using the process of claim 1 or a printing methodology selected from the group consisting of flexography, lithography, gravure, intaglio, ink jet, screen printing, offset lithography, and combinations thereof.

9. The process of claim 1, wherein the imaged gravure printing plate comprises a thin, flexible patterned printing plate formed by:
providing the gravure printing plate having a first major surface;
applying a release layer on the first major surface of the plate;
depositing a first material layer on the release layer;
polishing the first material layer to a surface roughness of about 1 micron or less;
applying a layer of photoresist material to the first material layer;
exposing at least a portion of the photoresist material to a light source to form soluble and non-soluble areas of photoresist material;
introducing a developer chemical to the printing plate with the first material layer to remove the soluble areas of photoresist material to form a relief of an image of an electrical circuit or circuit element such that areas of the first surface of the first material layer are exposed in recesses of the relief;
etching the exposed areas of the first material layer; and
removing the remaining photoresist material leaving the first material layer patterned having etched areas and non-etched areas such that the etched areas form an image of the electrical circuit or circuit element; and
separating the etched first material layer from the release layer and plate such that the etched first material layer forms the thin, flexible patterned printing plate including the image of the electrical circuit or circuit element.

* * * * *